United States Patent [19]

Tadama et al.

[11] 3,980,976

[45] Sept. 14, 1976

[54] COAXIAL CONNECTOR

[75] Inventors: Motomu Tadama, Yokohama; Yasunori Takahashi, Tokyo, both of Japan

[73] Assignee: Sony Corporation, Tokyo, Japan

[22] Filed: Mar. 21, 1975

[21] Appl. No.: 560,876

[30] Foreign Application Priority Data

Mar. 28, 1974 Japan .......................... 49-35800[U]

[52] U.S. Cl. .............................. 333/73 C; 317/256; 333/24 C; 333/70 CR; 333/97 R; 339/111; 339/278 A

[51] Int. Cl.[2] ...................... H03H 7/06; H03H 7/14; H01R 13/66; H01T 1/00

[58] Field of Search ............ 333/70 R, 70 CR, 73 R, 333/73 C, 70 S, 79, 97 R, 24 C; 339/147 R, 278 R, 278 A, 111, 114, 143 C; 317/242, 252, 256

[56] References Cited

UNITED STATES PATENTS

| | | | |
|---|---|---|---|
| 2,402,540 | 6/1946 | Espley | 333/73 C X |
| 2,968,772 | 1/1961 | Thomas, Jr. | 333/97 X |
| 2,994,048 | 7/1961 | Schlicke | 333/79 |
| 3,421,122 | 1/1969 | Ito et al. | 333/97 X |
| 3,443,251 | 5/1969 | Garstang et al. | 333/79 |

*Primary Examiner*—Alfred E. Smith
*Assistant Examiner*—Marvin Nussbaum
*Attorney, Agent, or Firm*—Lewis H. Eslinger; Alvin Sinderbrand

[57] ABSTRACT

A coaxial connector for a coaxial conductor, such as an antenna feeder, which can isolate one device from another along the length of the conductor, such as an antenna from a television receiver for avoiding electric shock. The connector includes a disc-shaped condenser and a circular condenser disposed around and coaxial with the disc-shaped condenser, central conductors and outer conductors of the coaxial conductor are connected through the disc-shaped condenser and the circular condenser respectively.

11 Claims, 6 Drawing Figures

COAXIAL CONNECTOR

BACKGROUND OF THE INVENTION

1. Field of the Invention

This invention relates generally to a connector for connecting coaxial cables which are useable for an antenna feeder and is directed more particularly to a coaxial connector capable of avoiding the hazard of an electric shock by isolating an antenna from a television set with respect to low frequency components.

2. Description of the Prior Art

In a transformer-less television receiver, the antenna should be isolated from the receiver with respect to low frequency components in order to avoid the hazard of an electric shock. To this end, generally a condenser is connected in series with a feeder which connects the receiver to the antenna. To minimize interference caused by undesirable signals which might be picked up by the feeder directly, and to improve the quality of a reproduced picture, it is desired to employ a coaxial cable as the feeder. Accordingly, the antenna is connected to the television tuner through the coaxial cable and isolation condenser combination.

In the prior art, as shown in FIG. 1 of the accomapnying drawings, a receptacle 1*a* for receiving a section of coaxial cable is formed of a central conductor 2*a*, an outer cylindrical conductor 3*a* which is provided with a flange 4*a*, and insulating material interposed between the central and outer cylindrical conductors 2*a* and 3*a*. Another receptacle 1*b* for receiving another section of coaxial cable is similar in construction to the receptacle 1*a* and is formed of a central conductor 2*b*, an outer cylindrical conductor 3*b* provided with a flange 4*b* and insulating material between the conductors 2*b* and 3*b*. These receptacles 1*a* and 1*b* are connected to male connectors which are provided at the ends of the coaxial cables connected to the antenna and tuner (not shown) respectively, to thereby furnish a signal path to the tuner from the antenna. The central conductors 2*a* and 2*b* are connected to each other through a condenser 5, and the outer cylindrical conductors 3*a* and 3*b* are connected to each other through a condenser 6.

Since the coaxial cable exhibits a very low tendency to pick up undesirable radio frequency signals (for example, a television signal will not be picked up by the coaxial cable other than the television signal which is applied from the antenna), the so-called noise immunity is improved by its use. However, when the condenser 6 is inserted mid-way into the coaxial cable, as described above, undesirable radio frequency signals, which flow normally only along the outer surface of the outer cylindrical conductor 3*a*, 3*b* of the coaxial cable, cause a voltage across the lead wires for the condenser 6. This is because of the inherent inductance of the lead wires which permits such voltage to be induced, with the result that undesirable signals caused thereby enter into the inner surface of the conductor 3*a*, 3*b* and then flow along such inner surface to be supplied to the tuner. In this case, if the undesired signals are inductively picked up television signals, and if there is a phase difference between these undesirable signals and the normal signals which are supplied to the coaxial cable from the antenna, a ghost image may appear in a reproduced television picture to deteriorate the quality of the picture (this may be caused by the fact that, since the coaxial cable usually is long, there is a time delay for the normal television signal to reach the condenser 6 from the antenna through the coaxial cable whereas there virtually is no delay for the undesirable television signal to be picked up directly by the condenser lead wires.

SUMMARY OF THE INVENTION

It is an object of this invention to provide a novel connector for coaxial cables.

Another object of this invention is to provide a coaxial connector which can isolate an antenna from the tuner of a television receiver.

A further object of this invention is to provide a coaxial connector which can be used advantageously with a transformer-less television receiver.

A still further object of this invention is to provide a coaxial connector which is substantially immune from undesirable signals and which avoids the aforenoted problem of inductive pick-up.

Various other objects, features and advantages of this invention will become apparent from the ensuing detailed description taken in conjunction with and the novel features will be pointed out in the appended claims.

In accordance with this invention, a coaxial connector for connecting a coaxial cable to a further device, such as another segment of coaxial cable, is formed with a plate of insulating material, a circular plate of insulating material disposed about the first-mentioned plate, a first pair of electrodes connected to opposite sides of said first-mentioned plate, a second pair of electrodes connected to opposite sides of said circular plate, a first coaxial receptacle having inner and outer coaxial conductors connected to first ones of said first and second pairs of electrodes, respectively, and a second coaxial receptacle having inner and outer coaxial conductors connected to the other ones of said first and second pairs of electrodes, respectively. Either or both of the coaxial receptacles are adapted to receive coaxial cables. The first pair of electrodes combine with the first-mentioned plate to form a first capacitor and the second pair of electrodes combine with circular plate to form a second capacitor. A discharge resistor and/or a spark gap is provided for either or both capacitors.

DESCRIPTION OF THE PREFERRED EMBODIMENTS

One embodiment of a coaxial connector according to this invention will be described with reference to FIG. 2.

A circular condenser 7, for the purpose of isolation in the outer coaxial conductor, is formed by attaching circular electrodes 7*b* and 7*c* to opposite surface of a circular dielectric plate 7*a*, and a disc-shaped condenser 8, for the purpose of isolation in the inner coaxial conductor, is formed by attaching disc-shaped electrodes 8*b* and 8*c* to opposite surfaces of a disc-shaped dielectric plate 8*a*, respectively. A receptacle 11*a* is formed of a central conductor 9*a* and an outer cylindrical conductor 10*a* coaxial therewith having an insulating material 12*a* interposed therebetween. Similarly, another receptacle 11*b* is formed of a central conductor 9*b* and an outer cylindrical conductor 10*b* coaxial therewith having an insulating material 12*b* interpased therebetween. The central conductors 9*a* and 9*b* of the pair of receptacles 11*a* and 11*b* are connected to the electrodes 8*b* and 8*c* of the disc-shaped condenser 8, respectively, so that the central conductors 9*a* and 9*b* are connected to both sides of the disc-shaped condenser 8. The circular condenser 7 is disposed so as to be substantially coaxial with the central conductors 9*a* and 9*b*. The ends of the outer conductors 10*a* and 10*b* of the receptacles 11*a* and 11*b* are connected to the electrodes 7*b* and 7*c* of the circular condenser 7, respectively. Accordingly, the receptacles 11*a* and 11*b* serve to grip the circular condenser 7 and disc-shaped condenser 8 therebetween, as shown.

Figure 1:
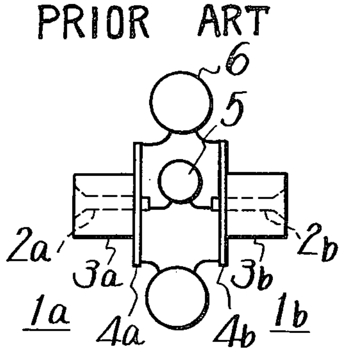
Fig. 1 PRIOR ART
FIG. 1 is a side view of a prior art coaxial connector.
Figure 2:
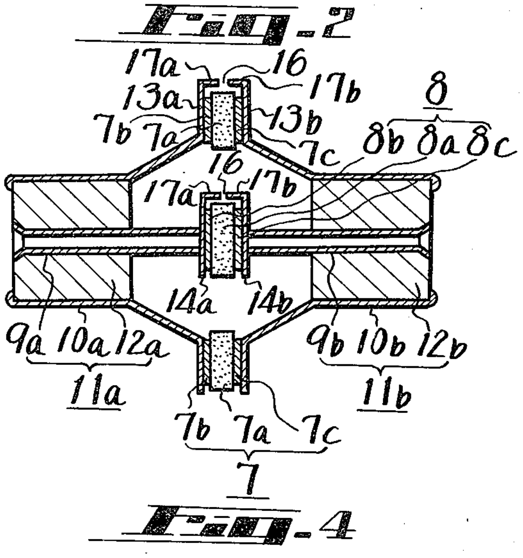
FIG. 2 is a cross-sectional view showing one embodiment of the coaxial connector according to this invention.

In the embodiment shown in FIG. 2, one end of each of the outer cylindrical conductors 10*a* and 10*b* is expanded to be of a funnel shape, and a terminating portion of each funnel-shaped end 13*a* and 13*b* is formed as a respective flange. The circular condenser 7 is gripped between these flanges 13*a* and 13*b*. Contacting plates 14*a* and 14*b* are respectively connected to the ends of the central conductors 9*a* and 9*b* which oppose each other in the mating receptacles 11*a* and 11*b*, and these contacting plates 14*a* and 14*b* are, in turn, in contact with the electrodes 8*b* and 8*c* of the disc-shaped condenser 8, respectively. Thus, the central conductors 9*a* and 9*b* are connected to the electrodes 8*b* and 8*c* of the disc-shaped condenser 8 through these contacting plates, respectively.

Figure 3:
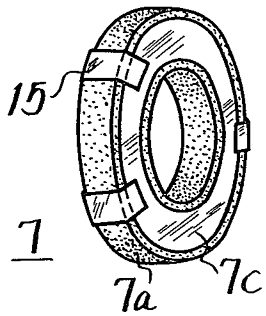
FIG. 3 is a perspective view showing a circular condenser which can be used in the coaxial connector of this invention.

A resistor 15 of relatively high resistance is provided between the electrodes 7*b* and 7*c* of the circular condenser 7 for discharging this condenser when it is charged. As shown in FIG. 3, the resistor 15 may be formed as a film resistor coating around the peripheral edge of the condenser 7 and betweeen the condenser electrodes 7*b* and 7*c*. In order to avoid damage to the condenser 7 in the event that a voltage pulse is applied across the electrodes 7*b* and 7*c* thereof, a spark gap 16 is formed between the electrodes 7*b* and 7*c* so as to provide electrically a small clearance therebetween.

Figure 4:
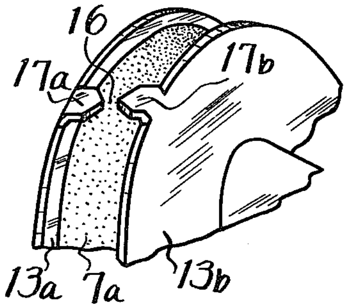
FIG. 4 is a perspective view showing a portion of the coaxial connector of FIG. 2 in an enlarged scale.

As shown in FIG. 4, the spark gap 16 may be formed by projections 17*a* and 17*b* extending from the flanges 13*a* and 13*b*, these projections 17*a* and 17*b* being bent toward each other across the outer peripheral edge of the condenser 7 to so as to have a clearance therebetween. In another embodiment, the spark gap is provided by coating conductive projections on the condenser 7 directly, similarly to the coated resistor 15.

While the foregoing description is directed to a discharge resistor and to a spark gap for the condenser 7, it should be appreciated that analogous devices can be provided for the disc-shaped condenser 8. In the interest of brevity, further description of such analogous devices, although depicted in FIG. 2, is omitted.

Although not shown, it should be understood that, male connectors are connected to ends of coaxial cables, and these male connectors are adapted to be detachably connected to the free ends of the receptacles 11*a* and 11*b*, respectively.

The coaxial connector FIG. 2 can be assembled as follows. Solder is attached to the respective electrodes 7*b*, 7*c* and 8*b*, 8*c* of the condensers 7 and 8, and the receptacles 11*a* and 11*b* are positioned to grip the condensers 7 and 8 therebetween. Then, the assembly is inserted into a suitable furnace, whereby the solder serves to secure the electrodes 7*b* and 7*c* of the condenser 7 to the flanges 13*a* and 13*b* and the electrodes 8*b* and 8*c* to the contracting plates 14*a* and 14*b*, respectively.

Since the connector of the invention is constructed so that the receptacles 11*a* and 11*b* grip the condensers 7 and 8 therebetween, the lead wires for the condensers 7 and 8 can be made very short. Thus, the impedance (and especially the inductive component) is very small so as to substantially avoid the picking up of undesirable radio frequency signals by the coaxial cable. Hence, interfering signals are not supplied to the tuner, with the result that the quality of the reproduced television picture is improved.

Further, since the central conductors of the coaxial cable are coupled by the condenser 8 and the outer conductors of the coaxial cable are coupled by the condenser 7, respectively, commercial AC current cannot flow through the coaxial cable, and the hazard of an electric shock is prevented.

By providing the resistor 15, which may be formed as shown in FIG. 3, the condensers 7 and 8 can be prevented from being charged. Additionally, by providing the spark gap 16, even if a voltage pulse is received, this can be suitably dissipated to prevent the condensers 7 and 8 from being damaged.

Because of its simple and inexpensive construction, the connector of this invention can be manufactured easily, and can be commercially marketed at low cost. Also, since the connector of this invention itself is of the coaxial type, it can be used advantageously for video signal reception up to a UHF band.

Figure 5:
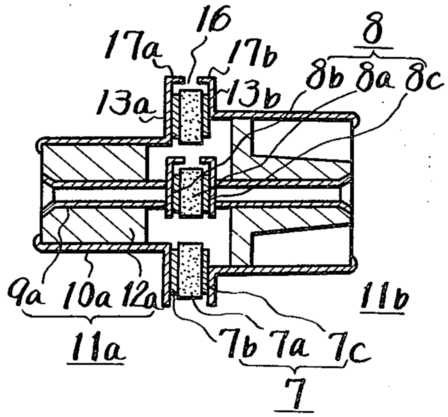
FIGS. 5 and 6 are cross-sectional view showing other embodiments of this invention, respectively.
Figure 6:
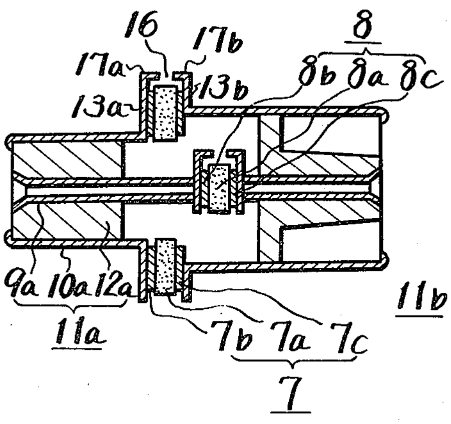

FIGS. 5 and 6 show other embodiments of this invention, respectively. In the example of FIG. 2, the pair of receptacles 11*a* and 11*b* are formed substantially identically and are symmetrical with respect to a center plane thereof, but in the embodiments of FIGS. 5 and 6 the individual receptacles are asymmetrical and are adapted to be coupled to different sizes of male connectors. In FIGS. 5 and 6, the same reference numerals are used as in FIG. 2 to designate corresponding elements. Since these elements are substantially the same as those which have been described hereinabove except for the asymmetry of the receptacles 11*a* and 11*b*, further description thereof is omitted in the interest of brevity.

It will be apparent that many modifications and variations in form and details could be effected by one of ordinary skill in the art without departing from the spirit and scope of the novel concepts of the present invention. Therefore, it is intended that the appended claims be interpreted as including all such modifications and variations.

We claim as our invention:

1. A coaxial connector comprising:

a. a first dielectric plate;

b. a first pair of electrodes mounted on opposite sides of said dielectric plate;

c. a circular dielectric plate disposed around said first dielectric plate coaxially;

d. a second pair of electrodes mounted on opposite sides of said circular dielectric plate;

e. a pair of central conductors, each central conductor connected to a corresponding one of said first pair of electrodes, respectively;

f. a pair of insulating members, each member disposed around a corresponding one of said central conductors, respectively;

g. a pair of electrical conducting hollow cylinders, each cylinder disposed around a corresponding one of said insulating members; and h. a pair of outer hollow conductors, each hollow conductor disposed between a corresponding one of said second pair of electrodes and one of said hollow cylinders, respectively.

2. A coaxial connector according to claim 1 further comprising at least one resistor connected across said second pair of electrodes.

3. A coaxial connector according to claim 2, wherein said resistor comprises a film resistor coated on an edge portion of said circular dielectric plate.

4. A coaxial connector according to claim 1 further comprising at least one spark gap provided across said second pair of electrodes.

5. A coaxial connector according to claim 4, wherein a pair of spark elements of said spark gap are formed as a portion of said outer hollow conductors.

6. A coaxial connector, comprising:

a first plate of dielectric material having first electrodes on opposite surfaces thereof;

a circular plate of dielectric material having second electrodes on opposite surfaces thereof, said circular plate being coaxial with said first plate;

a first coaxial receptacle having an inner conductor in contact, at one of its ends, with a first electrode on one surface of said first plate, and an outer conductor in contact, at one of its ends, with a second electrode on one surface of said circular plate, said outer conductor being coaxial with said inner conductor; and a second coaxial receptacle having an inner conductor in contact, at one of its ends, with a first electrode on the other surface of said first plate, and an outer conductor in contact, at one of its ends, with a second electrode on the other surface of said circular plate, said outer conductor of said second coaxial receptacle being coaxial with said inner conductor thereof; and the other end of each conductor of said first and second coaxial receptacles being adapted for electrical connection to further electrical components.

7. A coaxial connector according to claim 6 wherein the end of each conductor in contact with an electrode includes a flanged portion that is in contact therewith.

8. A coaxial connector according to claim 7 wherein a part of each flanged portion is provided with a projection to thereby form a spark gap across said first plate and a spark gap across said circular plate.

9. A coaxial connector according to claim 8 wherein the diameteer of the outer conductors of one of said coaxial receptacles is greater than the diameter of the outer conductors of the other of said coaxial receptacles.

10. A coaxial connector according to claim 8 wherein the plane of the first plate is parallel to and offset from the plane of the circular plate.

11. A coaxial connector according to claim 8 further comprising a discharge resistive film coated on a portion of the peripheral edge of said circular plate and electrically connected across said second electrodes.

* * * * *